(12) United States Patent
Srivastava et al.

(10) Patent No.: US 9,319,045 B1
(45) Date of Patent: Apr. 19, 2016

(54) METHOD AND APPARATUS FOR REDUCING GATE LEAKAGE OF LOW THRESHOLD TRANSISTORS DURING LOW POWER MODE IN A MULTI-POWER-DOMAIN CHIP

(71) Applicant: Texas Instruments Incorporated, Dallas, TX (US)

(72) Inventors: Sudesh Chandra Srivastava, Bangalore (IN); Vivek Singhal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/584,511

(22) Filed: Dec. 29, 2014

(51) Int. Cl.
*H03K 19/003* (2006.01)
*H03K 19/00* (2006.01)

(52) U.S. Cl.
CPC ...... *H03K 19/00361* (2013.01); *H03K 19/0008* (2013.01)

(58) Field of Classification Search
CPC .............. H03K 19/00361; H03K 19/0008; H03K 2217/9605
USPC .............................................. 326/15, 21–27
See application file for complete search history.

(56) References Cited

U.S. PATENT DOCUMENTS

| | | | |
|---|---|---|---|
| 9,112,484 B1* | 8/2015 | Clark | H03K 3/0315 |
| 2002/0140496 A1* | 10/2002 | Keshavarzi | H03K 19/00384 327/534 |
| 2006/0214687 A1* | 9/2006 | Arora | H03K 19/0016 326/82 |
| 2013/0069690 A1* | 3/2013 | Kim | H03K 19/0016 326/33 |
| 2015/0280716 A1* | 10/2015 | Vashishtha | H03K 19/09487 327/312 |

* cited by examiner

*Primary Examiner* — Jason M Crawford
(74) *Attorney, Agent, or Firm* — Ronald O. Neerings; Frank D. Cimino

(57) ABSTRACT

A circuit for reducing gate leakage current in a switchable power domain of a CMOS (complementary metal oxide semiconductor) integrated circuit chip includes a first transistor having a drain electrode coupled to a first terminal of a power switch having a second terminal coupled to a first reference voltage, the first transistor having a gate electrode, a body electrode, and a source electrode. The source electrode and body electrodes are coupled to a second reference voltage. The first transistor has a relatively high first gate leakage current that flows from its gate electrode to its body electrode if the power switch is open and a voltage of the gate electrode of the first transistor representing a first logic level exceeds a voltage of the body electrode by more than a first predetermined amount. A first circuit produces a relatively low voltage on the gate electrode of the first transistor representing a second logic level to substantially reduce the first gate leakage current when reduced power consumption of the chip is needed.

20 Claims, 9 Drawing Sheets

METHOD AND APPARATUS FOR REDUCING GATE LEAKAGE OF LOW THRESHOLD TRANSISTORS DURING LOW POWER MODE IN A MULTI-POWER-DOMAIN CHIP

BACKGROUND OF THE INVENTION

The present invention relates generally to a very low power "System on a Chip" (SOC) which can operate intermittently, but which most of the time is in its sleep mode or standby mode, and which can be powered for a very long amount of time (e.g., more than about a year) by a very small "button" battery. More particularly, the present invention relates to circuitry for reducing the amount of the MOS transistor gate leakage currents which typically contribute to power consumption of circuitry in a "switchable power domain" of the SOC chip.

The term "domain" or "power domain" generally refers to SOC chips. In a SOC chip, a certain activity or type of circuitry is provided in a region referred to as an "island" of a substrate on which the SOC chip is fabricated. One or more such power domains on the substrate may be coupled to a particular power supply voltage $V_{DD}$ by means of a one or more switches that are controlled by a control signal. Such power domains are referred to as "switchable power domains". One or more power domains of an SOC chip may be non-switchable or "always on" power domains (hereinafter, "AON power domains") that are always connected to $V_{DD}$.

FIG. 1 shows a switchable power domain circuit 1 including a conventional CMOS inverter 3 coupled to ground and also coupled by a power switch 4 to power supply voltage $V_{DD}$. CMOS inverter 3 includes a N-channel transistor MN1 having its source connected to ground, its body (or bulk) electrode connected to ground, its gate connected to an input conductor 2, and its drain connected to the drain of a P-channel MOS transistor MP1. The gate of transistor MP1 is connected to conductor 2, which conducts an input logic signal VLOGIC-IN. The source and body electrodes of transistor MP1 are connected to one terminal of power switch 4. The other terminal of power switch 4 is connected to $V_{DD}$. A control terminal 15 of power switch 4 receives a control signal SWITCH_CONTROL. Arrow 5N designates the direction of the current path of a gate leakage current $I_{LEAKN}$ of N-channel transistor MN1, and arrow 5P designates the direction of the current path of a gate leakage current $I_{LEAKP}$ of P-channel transistor MP1. The gate leakage currents $I_{LEAKN}$ and $I_{LEAKP}$ "tunnel" across the gate oxides of N-channel transistor MN1 and P-channel transistor MN1, respectively, if the voltage between the gate electrode and the body electrode (i.e., the voltage across the gate oxide) is sufficiently high. Such gate leakage currents typically have magnitudes in the range of picoamperes for HVT (high threshold voltage) transistors and in the range of microamperes for SVT (standard threshold voltage) transistors, as a cumulative effect of all of the transistors in a corresponding power domain of a SOC chip.

The gate leakage current $I_{LEAKN}$ in FIG. 1 is always present when power switch 4 is closed and VLOGIC-IN is simultaneously at a high "1" voltage level. For example, if $V_{DD}$ is equal to 1.25 V (volts) and power switch 4 is closed, then $I_{LEAKN}$ for an SVT transistor may be approximately 70 pA (picoamperes), and if power switch 4 is open, then $I_{LEAKN}$ may be much higher, approximately 800 pA. Also, if power switch 4 is open, and VLOGIC-IN is at a high "1" level, there may be a significant level of gate leakage current $I_{LEAKP}$ flowing through P-channel transistor MP1 if the source of transistor MP1 has "floated" down to a voltage level near ground. If a typical CMOS inverter 3 used in one embodiment of the invention, the total gate leakage current is zero pA for values of the input voltage between zero and approximately 700 mV (millivolts) and increases exponentially to nearly 200 pA when the CMOS inverter input voltage reaches about 1.1 V, and increases to about 400 pA when the input voltage reaches about 1.2 V, and increases to about 800 pA when the input voltage reaches about 1.25 V.

FIGS. 2A through 2D show several different examples of circuit configurations that can cause unacceptably high gate leakage currents that may be unacceptable in a CMOS SOC chip which needs to operate from a button battery for a long period of time (e.g., for longer than a year). FIG. 2A shows a switchable power domain 10A in an SOC chip which also includes an AON (always on) power domain 8A. AON power domain 8A includes various AON logic circuitry 11 and ISO control circuitry 12, both of which are directly connected to $V_{DD}$ and both of which also receive input signals from various other circuitry (not shown) on the chip. Switchable power domain 10A typically includes buffer circuitry 3 (which may be a CMOS inverter), switchable logic circuitry 16, and an isolation circuit or cell 14, all of which receive their operating power directly from $V_{DD}$ through conductor 6 and power switch 4 whenever power switch 4 is closed by an "active" logic level of a switch control signal SWITCH_CONTROL on conductor 15. Note that the signal ISO can open but cannot close power switch 4. Conductor 6 is connected to one terminal of power switch 4, the other terminal of which is connected to $V_{DD}$. Power switch 4 is opened in response to the active level of isolation control signal ISO and is closed the rest of the time. The output of AON logic circuitry 11 is connected to the input of input buffer circuitry (or CMOS inverter) 3 in switchable power domain 10A. The output of input buffer circuitry 3 is connected by conductor 7 to the input of switchable logic circuitry 16. The output of switchable logic circuitry 16 is connected to one input of isolation cell 14. An enable input of isolation cell 14 is connected by conductor 17 to the output ISO of AON isolation signal control circuitry 12. To turn switchable power domain 10A OFF, first an active level of ISO on conductor 17 domain is asserted. Then switch control input signal SWITCH_CONTROL on conductor 15 de-asserted. To turn switchable power domain 10A on, first switch control signal SWITCH_CONTROL is asserted, and then signal ISO on conductor 17 signal de-asserted.

When the switchable power domain 10A is OFF, power switch 4 is open but the input(s) of one or more switchable power domains may continue to receive input signals that may be either logic "1"s or logic "0"s from AON logic circuitry 11. Consequently, the CMOS input inverter 3 in FIG. 1, which can be used as input buffer circuitry 3 in FIG. 2, is likely to have a significant amount of gate leakage current, depending on whether it is receiving a logic "1" or a logic "0" from AON logic circuitry 11. (Conductor 7 will be, in a sense, "floating" but since switchable power domain 10A is OFF it will not cause any "floating" CMOS gate leakage current. The only leakage current that occurs in this case is the gate leakage current in buffer 3.)

Referring to FIG. 2B, a D-type flip-flop circuit 18 is shown which typically performs the function of retaining data in a switchable power domain if that switchable power domain is in its OFF condition. D-type flip-flop circuit 18 includes an input inverter X2, a master latch 18A including CMOS input inverters X3 and X4, a CMOS transmission gate M1, a slave latch 18B including CMOS output inverters X5 and X6, and an output inverter X7. The output of master latch 18A is coupled by CMOS transmission gate M1 to the input of slave latch 18B. D-type flip-flop 18 is composed of HVT transistors and master latch 18A includes only SVT transistors, in order to reduce gate leakage currents therein, except that output inverter X7 is formed using SVT (standard threshold VT) transistors to provide increased drive current at the output of output inverter X7 so it can adequately drive other circuitry (not shown). Note that since the output of slave latch 18B may be generating a "1" voltage level while its associated switchable power domain is OFF, the gate of output inverter X7 may have an a high gate leakage current (see FIG. 1) that may be as high as roughly 1.5 µA, as a cumulative effect of all of the transistors on a SOC chip. (The term "low threshold transistor" or "SVT transistor" is used herein to refer to relatively small, relatively inexpensive CMOS transistors of the kind used for most of the transistors on a SOC chip, whereas the term "high threshold transistor" or "HVT transistor" is used herein to refer to relatively large, relatively expensive CMOS transistors of having a substantially higher threshold voltage $V_T$ than that of the SVT transistors.)

Referring to FIG. 2C, circuitry 20 includes a memory array 20-1 which is composed of HVT transistors to reduce gate leakage currents therein while a switchable power domain containing memory array 20-1 is in its OFF condition, i.e., during the "retention mode" of memory array 20-1. The individual memory cells in memory array 20-1 can be similar to or the same as the D-type flip-flops 18 of FIG. 2C. Circuitry 20 in FIG. 2C also includes conventional associated peripheral logic circuitry 20-2 coupled to memory array 20-1 to effectuate ordinary read and write operations of memory array 20-1. Peripheral logic 20-2 is contained in a switchable power domain. It is conventional to improve the read/write performance achieved by means of peripheral logic circuitry 20-2 by utilizing SVT transistors. Unfortunately, this greatly increases the amount of gate leakage current of the kind previously described with reference to FIG. 1 and substantially decreases the life of a button battery used to power circuitry 20 of FIG. 2C.

Referring next to FIG. 2D, a low-power SOC chip 21 includes a switchable power domain 21-1 which is illustrated as being in its OFF condition. Switchable power domain 21-1 includes logic circuitry 21-2, an input of which is driven by AON (always on) circuitry 21-3 in an adjacent AON power domain. AON circuitry 21-3 may include digital and/or analog circuitry that may be applying a high logic "1" voltage level to digital logic circuitry 21-2 in switchable power domain 21-1. Consequently, there may be unacceptably large amounts of gate leakage current in logic circuitry 21-2 even while power domain 21-1 is in its OFF condition.

Referring next to FIG. 2E, a typical prior art isolation cell circuit 14 (also mentioned in FIG. 2A) includes a CMOS inverter including a P-channel transistor M02 and a N-channel transistor M03 having their corresponding gate electrodes connected to an input signal INPUT on conductor 23-1. The source of transistor M03 is connected to ground and its drain is connected to the drain of transistor M02 and to the gate electrodes of another CMOS inverter including P-channel transistor M06 and N-channel transistor M04. The source of transistor M02 is connected by conductor 6A to the source of transistor M06 and to the drain of a P-channel power switch transistor M01. The source of transistor M04 is connected to ground and its drain is connected to the drain of transistor M06 and to an output conductor 23-2 on which the signal OUTPUT is generated. The source of transistor M01 is connected to $V_{DD}$ and its gate is connected by conductor 17 to AON isolation control circuitry 12 (shown in FIG. 2A) to receive isolation control signal ISO. A N-channel transistor M05 has its gate electrode connected to ISO, its source connected to ground, and its drain connected to conductor 23-2. If ISO is at its "active" level, transistor M01 of ISO cell 14 may be OFF, but the gate electrodes of transistors M02 and M06 may be electrically floating. However, this will not cause indeterminate output voltage levels on conductor 23-2 because when ISO is low, transistor M05 will be ON, which will ensure a "0" voltage level on conductor 23-2.

A problem of prior art ISO cell circuit 14 circuit in FIG. 2E is that the ISO signal generated on conductor 17 by the AON ISO control circuitry 12 (see FIG. 2A) causes gate leakage current at the gate of transistor M01. Also, using HVT transistors in isolation cell 14 substantially reduces the operating speed of the SOC chip in which isolation cell 14 is located. Furthermore, using SVT transistors in the output inverter X7 of a D-type flip-flop (as shown in FIG. 2B) can cause substantially increased gate leakage current in N-channel transistor M05.

Thus, it should be appreciated that during the sleep mode or standby mode of an SOC, the switched power domains containing high-performance logic circuitry have been switched OFF to substantially reduce gate leakage currents therein. However, if AON circuitry is applying a "1" voltage level to the gate electrode of a SVT transistor in a switchable power domain that is in its OFF condition, there nevertheless will be a substantial amount of gate leakage current in that transistor even though its power domain is OFF.

It also should be appreciated that some low-power RF products including a SOC chip need to be powered for more than a year by a small button-type battery. In many such products the SOC chip spends more than 90% of its time in its sleep or standby mode. Therefore, the amount of gate leakage current and associated power dissipation in the SOC chip during sleep or standby mode operation is very important to the objective of extending the life of the battery. Unfortunately, the above described conventional technique of using high threshold voltage isolation cells composed of HVT transistors in isolation cells to reduce gate leakage current reduces circuit performance in various ways.

Therefore, there is an unmet need for an improved circuit and method for reducing the amount of gate leakage current in a power domain that is switched OFF in an integrated circuit chip.

There also is an unmet need for an improved circuit and method for extending the life of a battery that needs to provide power as needed to a SOC chip for a long period of time.

SUMMARY OF THE INVENTION

It is an object of the invention to provide an improved circuit and method for reducing the amount of gate leakage current in a power domain that is switched OFF in an integrated circuit chip.

It is another object of the invention to provide an improved circuit and method for extending the life of a battery that needs to provide power as needed to a SOC chip for a long period of time.

Briefly described, and in accordance with one embodiment, the present invention provides a circuit (25,26) for reducing gate leakage current in a switchable power domain (10A) of a CMOS (complementary metal oxide semiconductor) integrated circuit chip (28) includes a first transistor (MN1) having a drain electrode coupled to a first terminal (6) of a power switch (4) having a second terminal coupled to a first reference voltage ($V_{DD}$), the first transistor having a gate electrode, a body electrode, and a source electrode. The source electrode and body electrodes are coupled to a second reference voltage (GND). The first transistor has a relatively high first gate leakage current ($I_{LEAKN}$) that flows from its gate electrode to its body electrode if the power switch is open and a voltage of the gate electrode of the first transistor representing a first logic level exceeds a voltage of the body electrode by more than a first predetermined amount. A first circuit (25-2,26-2) produces a relatively low voltage on the gate electrode of the first transistor representing a second logic level to substantially reduce the first gate leakage current when reduced power consumption of the chip is needed.

In one embodiment, the invention a circuit (25,26) for reducing gate leakage current in a switchable power domain (10A) of a CMOS (complementary metal oxide semiconductor) integrated circuit chip (28), including a first transistor (MN1) having a drain electrode coupled to a first terminal (6) of a power switch (4) having a second terminal coupled to a first reference voltage ($V_{DD}$), the first transistor (MN1) having a gate electrode, a body electrode, and a source electrode, the source electrode and body electrodes being coupled to a second reference voltage (GND), the first transistor (MN1) having a relatively high first gate leakage current ($I_{LEAKN}$) that flows from its gate electrode to its body electrode if the power switch (4) is open and a voltage of the gate electrode of the first transistor (MN1) representing a first logic level ("1") exceeds a voltage of the body electrode by more than a first predetermined amount. A first circuit (25-2,26-2) produces a relatively low voltage on the gate electrode of the first transistor representing a second logic level ("0") to substantially reduce the first gate leakage current ($I_{LEAKN}$) when reduced power consumption of the chip (28) is needed.

In one embodiment, the first circuit (25-2) includes a logic ANDing circuit (25-2) which has a first input coupled to receive a first logic signal (VLOGIC_IN) and a second input coupled to receive a gate leakage current disabling signal (ISO), an output (2) of the logic ANDing circuit (25-2) being coupled to the gate electrode of the first transistor (MN1), wherein the logic ANDing circuit (25-2) applies the relatively low voltage on the gate electrode of the first transistor (MN1) when the gate leakage current disabling signal (ISO) has a predetermined active value indicating that the power switch (4) is open. A second transistor (MP1) has a source electrode and a body electrode coupled to the first terminal (6) of the power switch (4) having a drain electrode coupled to and the drain electrode of the first transistor (MN1).

In one embodiment, the first transistor (MN1) is a N-channel transistor and the second transistor (MP1) is a P-channel transistor, the second transistor (MP1) having a gate electrode coupled to the gate electrode of the first transistor (MN1), the first (MN1) and second (MP1) transistors forming a CMOS inverter (3). The first transistor (MN1) is a SVT (low threshold voltage) transistor, and the second transistor (MP1) is a SVT (low threshold voltage) transistor.

In one embodiment, the first circuit (26-2) includes a CMOS inverter (26-2) composed of HVT (high threshold) transistors. A second transistor (MP1) is coupled between the first terminal (6) of the power switch (4) and the drain electrode of the first transistor (MN1). The first transistor (MN1) is a N-channel transistor and the second transistor (MP1) is a P-channel transistor, and the second transistor (MP1) has a gate electrode coupled to the gate electrode of the first transistor (MN1), whereby the first (MN1) and second (MP1) transistors form a CMOS inverter (3).

In one embodiment, the logic ANDing circuit (25-2) includes AND gate circuitry. In one embodiment the first logic signal (VLOGIC_IN) is a gated logic signal that has been produced to have a logic level that causes the first circuit (26-2) to produce a low voltage level on the gate (2) of the first transistor (MN1) when the power switch (4) is open.

In one embodiment, the invention provides a method for reducing gate leakage current in a switchable power domain (10A) of a CMOS (complementary metal oxide semiconductor) integrated circuit chip (28), the method including coupling a drain electrode of a first transistor (MN1) to a first terminal (6) of a power switch (4) having a second terminal coupled to a first reference voltage ($V_{DD}$), and coupling a body electrode and a source electrode of the first transistor (MN1) to a second reference voltage (GND), the first transistor (MN1) having a gate electrode and a relatively high first gate leakage current ($I_{LEAKN}$) that flows from its gate electrode to its body electrode if the power switch (4) is open and a voltage of the gate electrode of the first transistor (MN1) representing a first logic level ("1") exceeds a voltage of the body electrode by more than a first predetermined amount; and producing a relatively low voltage on the gate electrode of the first transistor (MN1) representing a second logic level ("0") to substantially reduce the first gate leakage current ($I_{LEAKN}$) when reduced power consumption of the chip (28) is needed.

In one embodiment, the method includes coupling a first input of a logic ANDing circuit (25-2) to receive a first logic signal (VLOGIC_IN) and coupling a second input of the logic ANDing circuit (25-2) to receive a gate leakage current disabling signal (ISO), coupling an output (2) of the logic ANDing circuit (25-2) to the gate electrode of the first transistor (MN1), and operating the logic ANDing circuit (25-2) to cause it to apply the relatively low voltage on the gate electrode of the first transistor (MN1) when the gate leakage current disabling signal (ISO) has a predetermined active value indicating that the power switch (4) is open.

In one embodiment, the method includes coupling a source electrode and a body electrode of a second transistor (MP1) to the first terminal (6) of the power switch (4) and coupling a drain electrode of the second transistor (MP1) to the drain electrode of the first transistor (MN1), wherein the first transistor (MN1) is a N-channel transistor and the second transistor (MP1) is a P-channel transistor, the second transistor (MP1) having a gate electrode coupled to the gate electrode of the first transistor (MN1), the first (MN1) and second (MP1) transistors forming a CMOS inverter (3), wherein the first (MN1) and second (MP1) transistors are SVT (low threshold voltage) transistors.

In one embodiment, the method includes coupling an input of a CMOS inverter (26-2) to receive a first logic signal (VLOGIC_IN) and coupling an output (2) of the CMOS inverter (26-2) to the gate electrode of the first transistor (MN1), and operating the CMOS inverter (26-2) to cause it to apply the relatively low voltage on the gate electrode of the first transistor (MN1) when the power switch (4) is open, wherein the CMOS inverter (26-2) is composed of HVT (high threshold) transistors.

In one embodiment, the method includes providing the first logic signal (VLOGIC_IN) as a logic signal that has been produced to have a logic level that causes the first circuit (26-2) to produce a low voltage level on the gate (2) of the first transistor (MN1) when the power switch (4) is open.

In one embodiment, the invention provides a circuit (25, 26) for reducing gate leakage current in a switchable power domain (10A) of a CMOS (complementary metal oxide semiconductor) integrated circuit chip (28), including means (2,3, 6) in the switchable power domain (10A) for coupling a drain electrode of a first transistor (MN1) to a first terminal (6) of a power switch (4) having a second terminal coupled to a first reference voltage ($V_{DD}$) and coupling a body electrode and a source electrode of the first transistor (MN1) to a second reference voltage (GND), the first transistor (MN1) having a gate electrode and a relatively high first gate leakage current ($I_{LEAKN}$) that flows from its gate electrode to its body electrode if the power switch (4) is open and a voltage of the gate electrode of the first transistor (MN1) representing a first logic level ("1") exceeds a voltage of the body electrode by more than a first predetermined amount; and means (25-2,26-2) in the switchable power domain (10A) for producing a relatively low voltage on the gate electrode of the first transistor (MN1) representing a second logic level ("0") to substantially reduce the first gate leakage current ($I_{LEAKN}$) when reduced power consumption of the chip (28) is needed.

DETAILED DESCRIPTION OF THE PREFERRED EMBODIMENTS

Various experiments were performed to measure and characterize gate leakage current in various MOS transistors, wherein a logic "0" voltage level was applied to the gate electrodes of the P-channel and N-channel transistors of various CMOS inverters. No significant amount of gate leakage current across the gate oxides of the transistors to the grounded source electrodes and grounded body electrodes was detected with the "0" level applied. Also, logic "1" voltage levels were applied to the gate electrodes of the P-channel and N-channel transistors of the CMOS inverters with the body electrodes grounded. The amounts of the resulting gate leakage currents across the gate oxides of the transistors to the grounded body electrodes were measured, and it was determined that there is no significant gate leakage current (compared to sub-threshold leakage currents in the switchable power domain) in CMOS transistors in a switchable power domain when that power domain is switched ON. It also was determined that a relatively large and significant amount of gate leakage current is drawn from the battery when a high "1" logic voltage is applied to the gate electrodes of transistors in the switchable power domain when it is switched OFF.

Figure 1:
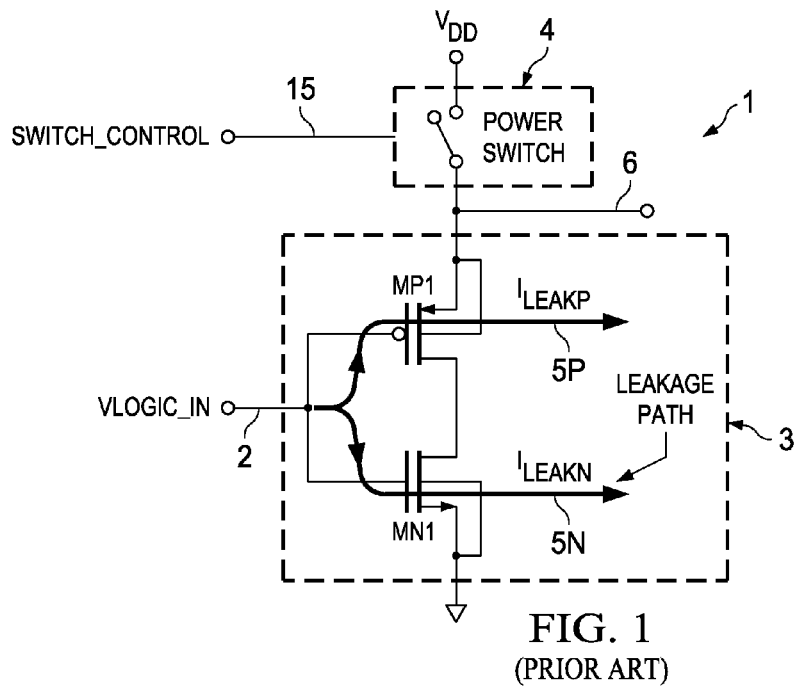
FIG. 1 is a schematic diagram illustrating gate leakage currents of a CMOS inverter receiving an input signal generated by AON (always on) circuitry in an SOC chip.
Figure 3A:
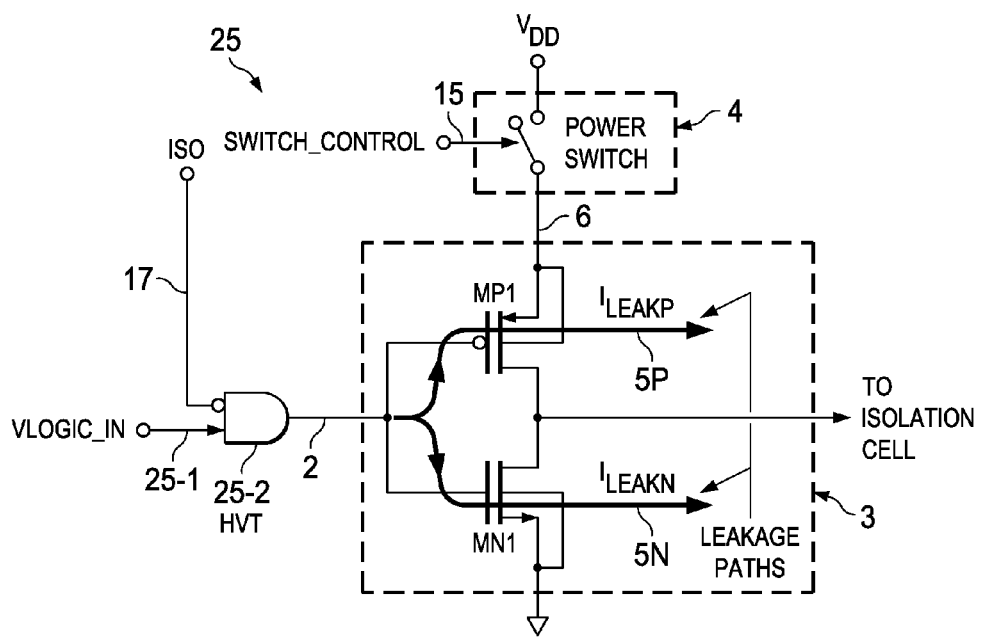
FIG. 3A is a simplified schematic diagram of one embodiment of the invention.

FIG. 3A shows a switchable power domain circuit 25 including a CMOS inverter 3 coupled between ground and one terminal 6 of a power switch 4, the other terminal of which is connected to power supply voltage $V_{DD}$. As in Prior Art FIG. 1, CMOS inverter 3 in FIG. 3A includes a N-channel transistor MN1 having its source electrode connected to ground, its body electrode connected to ground, its gate electrode connected to conductor 2, and its drain connected to the drain of a P-channel MOS transistor MP1. The gate of transistor MP1 is connected by input conductor 2 to conduct logic signal VLOGIC_IN. The source and body electrodes of transistor MP1 are connected to terminal 6 of power switch 4. A control terminal of power switch 4 receives control signal SWITCH_CONTROL on conductor 15. Arrow 5N designates the path of a gate leakage current $I_{LEAKN}$ of N-channel transistor MN1, and arrow 5P designates the path of a gate leakage current $I_{LEAKP}$ of P-channel transistor MP1. The gate leakage currents $I_{LEAKN}$ and $I_{LEAKP}$ in effect tunnel across the gate oxides of N-channel transistor MN1 and P-channel transistor MN1, respectively, if the voltages across their gate oxides are sufficiently high. For HVT (high threshold) transistors, the cumulative gate leakage current of all transistors in the power domain may have magnitudes in the order of picoamperes, and for SVT (standard threshold) transistors, the gate leakage currents may have magnitudes in the range of microamperes for the cumulative effect of all transistors.

In accordance with one embodiment of the invention, one input of an HVT AND gate 25-2 (or the like) receives the signal VLOGIC-IN on conductor 25-1 and the other input receives a gating signal or enable signal ISO on conductor 17. The output of enable gate 25-2 is connected by conductor 2 to the input of CMOS inverter 3. An "active" level of ISO applied to the input of AND gate 25-2 causes it to generate a low "0" voltage level on conductor 2. In this example, an "active" or "1" level of ISO is a high voltage. The signal ISO is "asserted" as an active "1" while the switchable power domain is OFF. To drive a "0" level to reduce gate leakage current while the switchable power domain is OFF, AND gate 25-2 is shown with a "bubble" at its input to indicate that the asserted ISO signal can drive a "0" level on conductor 2, in order to reduce the gate leakage current. The ISO signal therefore disables the gate leakage currents $I_{LEAKN}$ and $I_{LEAKP}$ by causing the above-mentioned low "0" voltage level on the gate electrodes of transistors MP1 and MN1 of CMOS inverter 3. That is, AND gate 25-2 responds to the ISO signal to produce the low "0" voltage level on CMOS inverter input 2 when ISO has a value indicating that the switchable power domain containing CMOS inverter 3 is OFF. Since the high values of gate leakage currents $I_{LEAKN}$ and $I_{LEAKP}$ occur when the voltage on conductor 2 is at a high "1" voltage level while power switch 4 is open (i.e., when the switchable power domain is OFF), the low "0" voltage level forced onto conductor 2 effectively disables leakage currents $I_{LEAKN}$ and $I_{LEAKP}$.

Figure 3B:
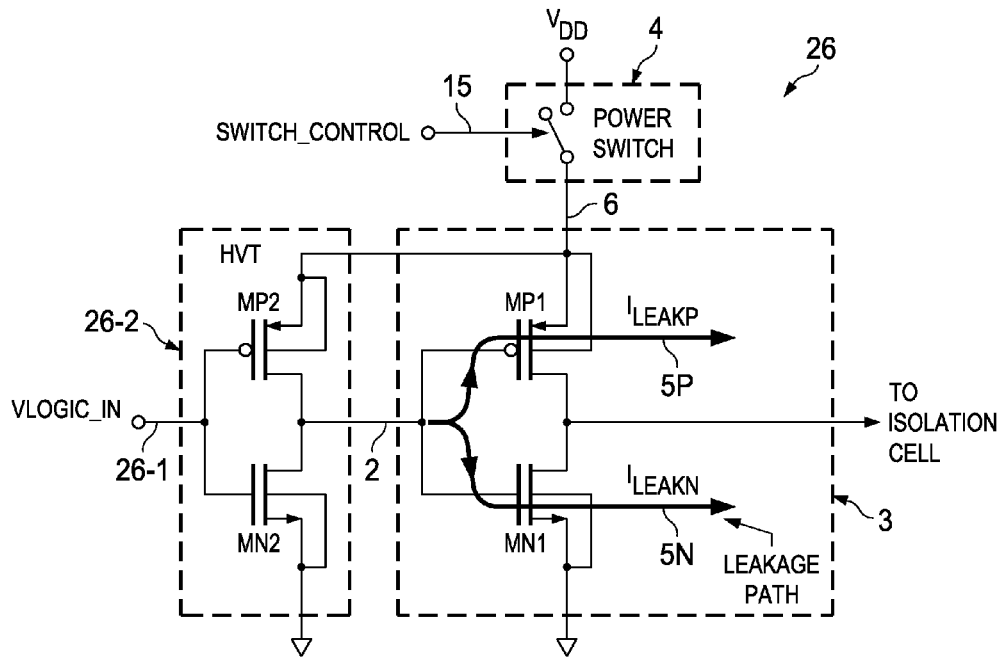
FIG. 3B is a simplified schematic diagram of another embodiment of the invention.

FIG. 3B shows another embodiment of the invention, wherein domain enable AND gate 25-2 of FIG. 3A is replaced by a CMOS inverter 26-2 coupled between $V_{DD}$ and ground.

CMOS inverter 26-2 of FIG. 3B includes a P-channel transistor MP2 having its source and body electrodes connected by conductor 6 to power switch 4, its drain electrode coupled by conductor 2 to the drain of a N-channel transistor MN2 having its source and body electrodes connected to ground. Conductor 2 also is connected to the input of CMOS inverter 3. The gate electrodes of transistors MP2 and MN2 are connected to receive VLOGIC_IN on conductor 26-1. The digital input signal VLOGIC_IN forces the input voltage of CMOS inverter 3 (also see FIG. 3B) to be a "0" when the switched power domain containing the CMOS inverter 3 is in its OFF condition. Since HVT inverter 26-2 is powered through conductor 6 and power switch 4, HVT inverter 26-2 does not produce a "1" level on conductor 2 and cause gate leakage current to occur in inverter 3 while its switchable power domain is OFF. Transistors MP2 and MN2 are HVT (high threshold voltage) transistors, in order to minimize gate leakage currents in inverter 26-2. Thus, another way of substantially reducing gate current leakage in an SOC chip is to connect to the output of an HVT CMOS inverter to the input of a SVT (low threshold voltage) CMOS inverter such as inverter 3 that is located in a switchable power domain, and connect the input of the HVT inverter to receive an input logic signal such as VLOGIC_IN generated by circuitry in an AON power domain. Note that gate leakage current occurs only in the gate electrode of a transistor in a switchable power domain if that gate electrode receives a signal generated by a transistor in an AON power domain. Therefore, that gate leakage current can be greatly reduced if the transistor in which it occurs is an HVT transistor.

Note that approaches of FIGS. 3A and 3B provide approximately the same amount of reduction in gate leakage current and therefore approximately the amount of increase in battery life.

Figure 4A:
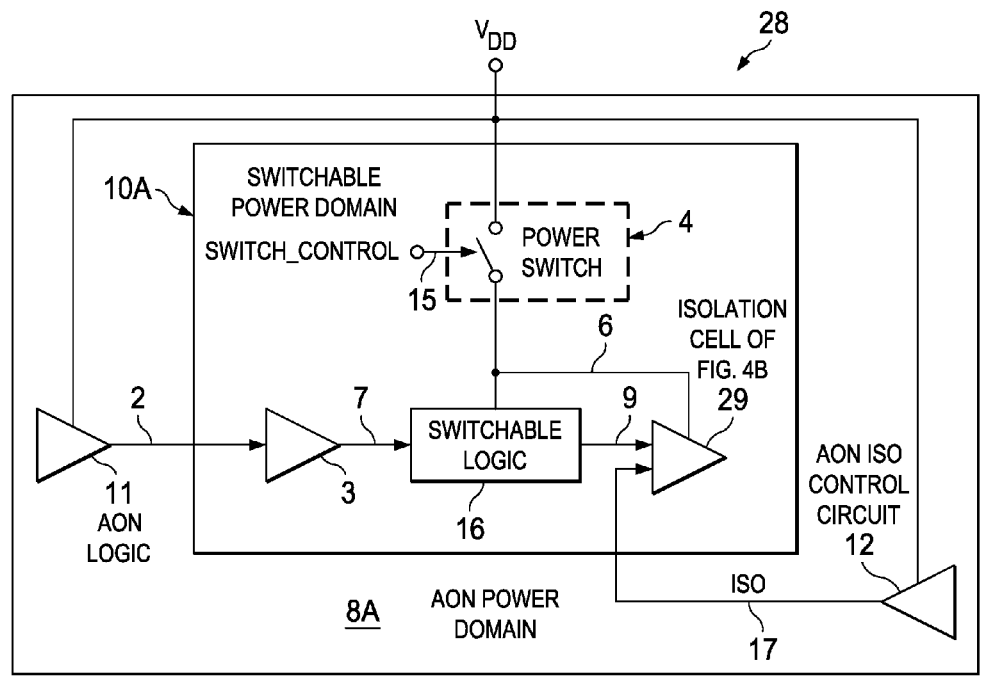
FIG. 4A is a block diagram illustrating a switchable power domain and associated circuitry in an AON power domain of a SOC chip.

FIG. 4A shows an SOC chip 28 which includes an AON (always on) power domain 8A and a switchable power domain 10A. AON power domain 8A includes various AON logic circuitry 11 and ISO control circuitry 12, both of which are directly connected to $V_{DD}$, and both of which receive input signals from various other circuitry (not shown). Switchable power domain 10A typically includes buffer circuitry 3 (such as a CMOS inverter), switchable logic circuitry 16, and an isolation cell 29, all of which receive their operating power indirectly from $V_{DD}$ through conductor 6 and power switch 4 whenever power switch 4 is closed in response to an active level of an isolation control signal. Conductor 6 is connected to one terminal of power switch 4, the other terminal of power switch 4 being connected to $V_{DD}$. The output of AON logic circuitry 11 is connected by conductor 2 to an input of input buffer circuitry 3 in switchable power domain 10A. The input of switchable logic circuitry 16 is connected by conductor 7 to an output of buffer circuit 3. The output of switchable logic circuitry 16 is connected to one input of isolation cell 29. Another input of isolation cell 29 receives isolation control signal ISO via conductor 17, which also is connected to the output of AON isolation signal control circuitry 12.

Figure 2A:
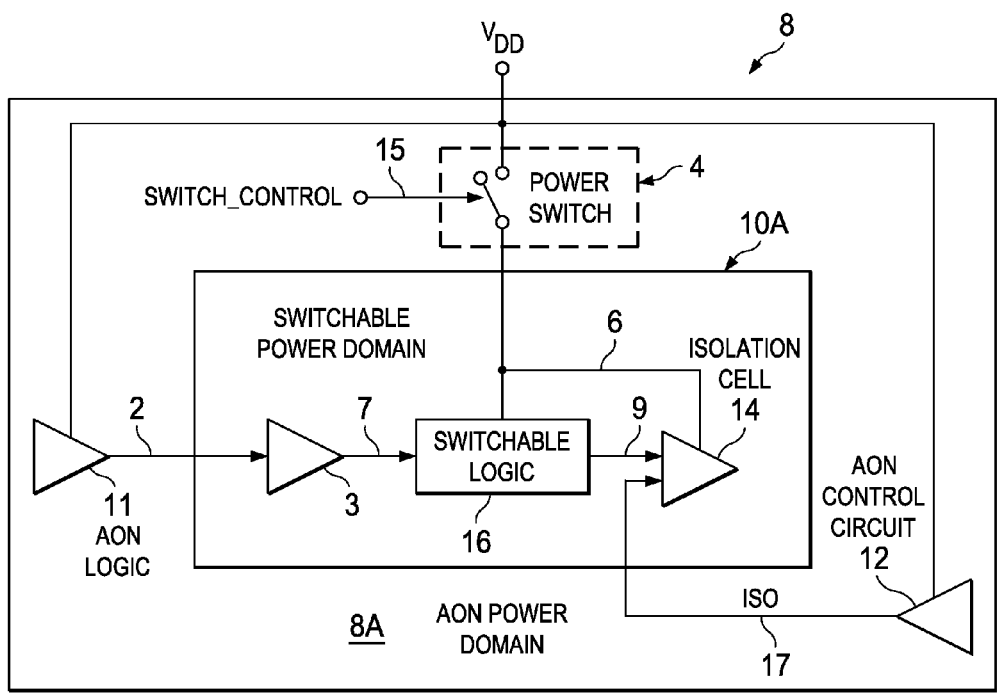
FIG. 2A is a block diagram of a switchable power domain and associated circuitry in an SOC chip.

When switchable power domain 10A is OFF, power switch 4 is open. However, the input(s) of one or more switchable power domains may continue to receive input signals which may be either logic "1"s or logic "0"s from AON logic circuitry 11. Consequently, an input transistor of buffer 3 is likely to have a significant amount of gate leakage current, depending on whether or not it is receiving a logic "1" or a logic "0" from AON logic circuitry 11, and that gate leakage current is reduced by providing buffer 3 as an HVT buffer. As in FIG. 2A, conductor 7 can be thought of as "floating", but since power supply power domain 10A is OFF it will not cause any floating CMOS gate leakage current. The only leakage current that occurs in this case is gate leakage current in buffer 3.

Figure 4B:
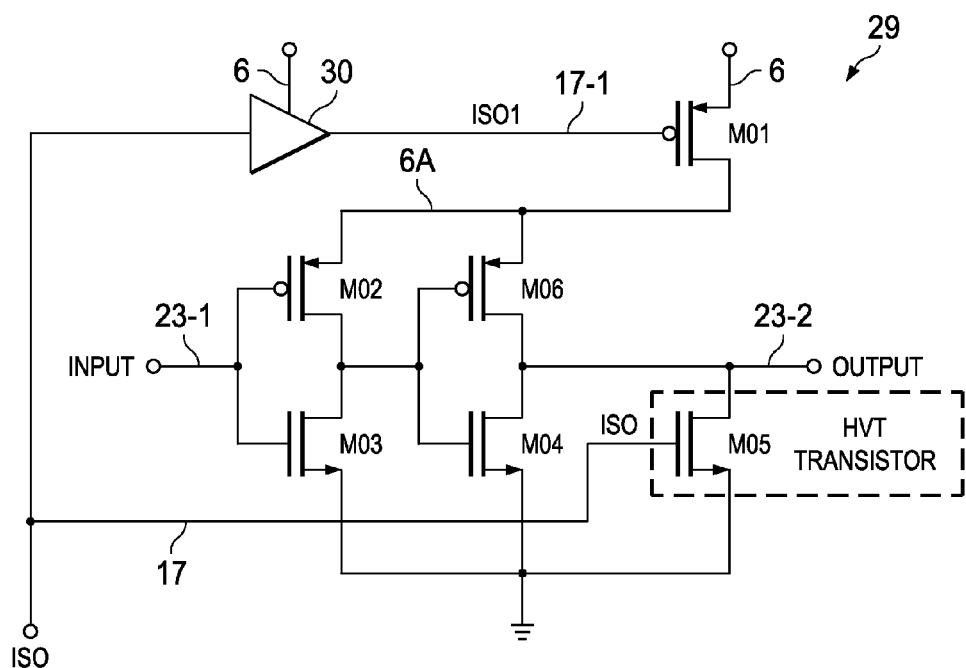
FIG. 4B is a schematic diagram of an isolation cell for use in a switchable power domain.

Referring next to FIG. 4B, isolation cell circuit 29 includes a CMOS inverter including a P-channel transistor M02 and a N-channel transistor M03 having their gate electrodes connected to an input signal INPUT on conductor 23-1. The source of transistor M03 is connected to ground and its drain is connected to the drain of transistor M02 and to the gate electrodes of another CMOS inverter including P-channel transistor M06 and N-channel transistor M04. The source of transistor M02 to is connected to the source of transistor M06 and to the drain of a P-channel transistor M01. The source of transistor M01 is coupled through conductor 6 and previously described power switch 4 to $V_{DD}$ and its gate is connected by conductor 17-1 to receive the isolation control signal ISO1 generated by the output of a buffer circuit 30, the input of which is connected by conductor 17 to the output ISO of AON isolation control circuitry 12 (shown in FIG. 4A). Buffer circuit 30 is powered indirectly from $V_{DD}$ through conductor 6 and previously described power switch 4. The source of transistor M04 is connected to ground and its drain is connected to the drain of transistor M06 and to an output conductor 23-2 on which the signal OUTPUT is generated. A N-channel HVT (high threshold voltage) transistor M05 has its source connected to ground, its gate connected to receive isolation control signal ISO, and its drain connected to conductor 23-2. The rest of isolation cell 29 is composed of SVT (standard threshold) transistors. Note that buffer 30 can drive multiple isolation cells.

Figure 5A:
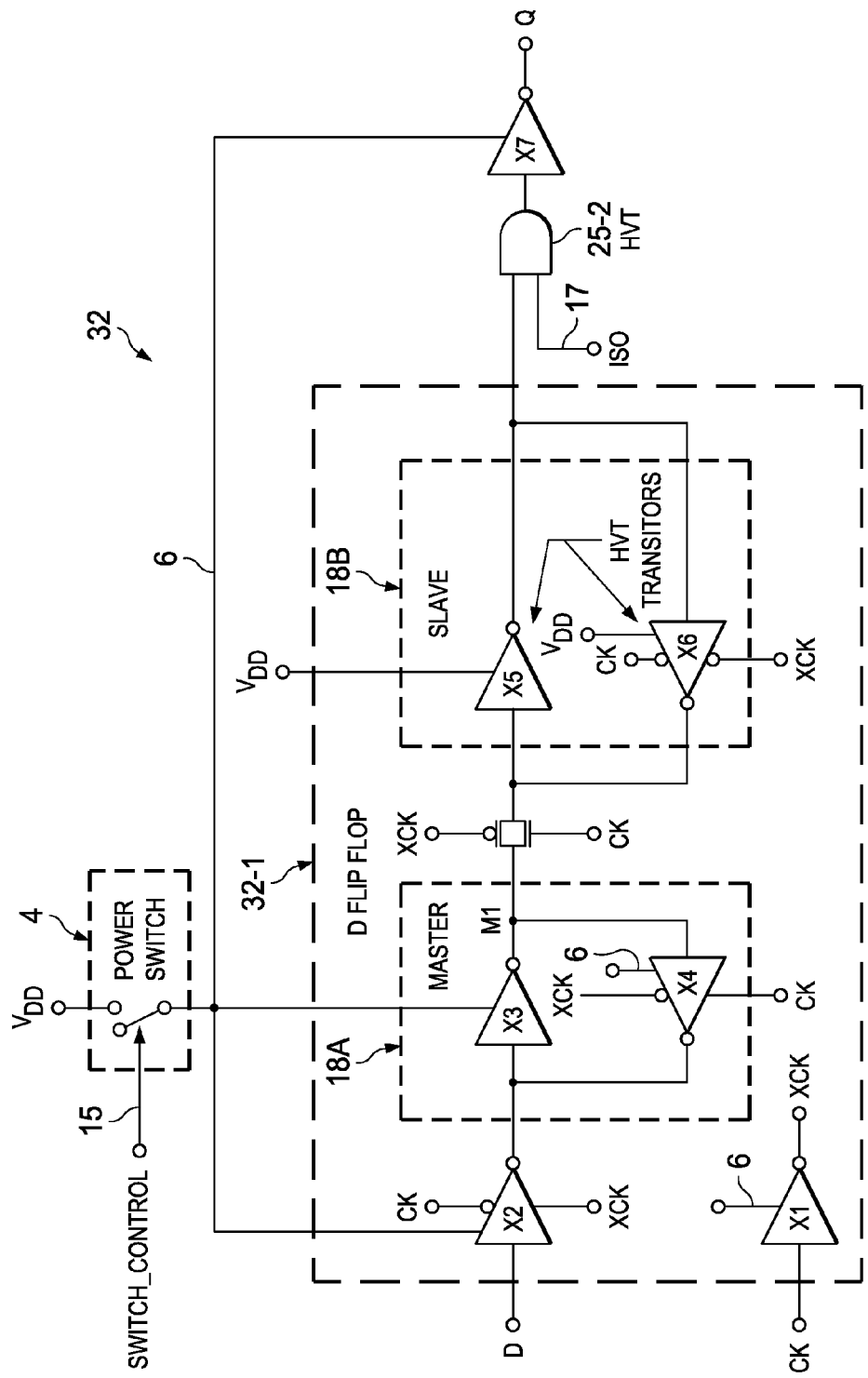
FIG. 5A a block diagram of a D-type flip-flop used in conjunction with the circuit and technique shown in FIG. 3A.
Figure 5B:
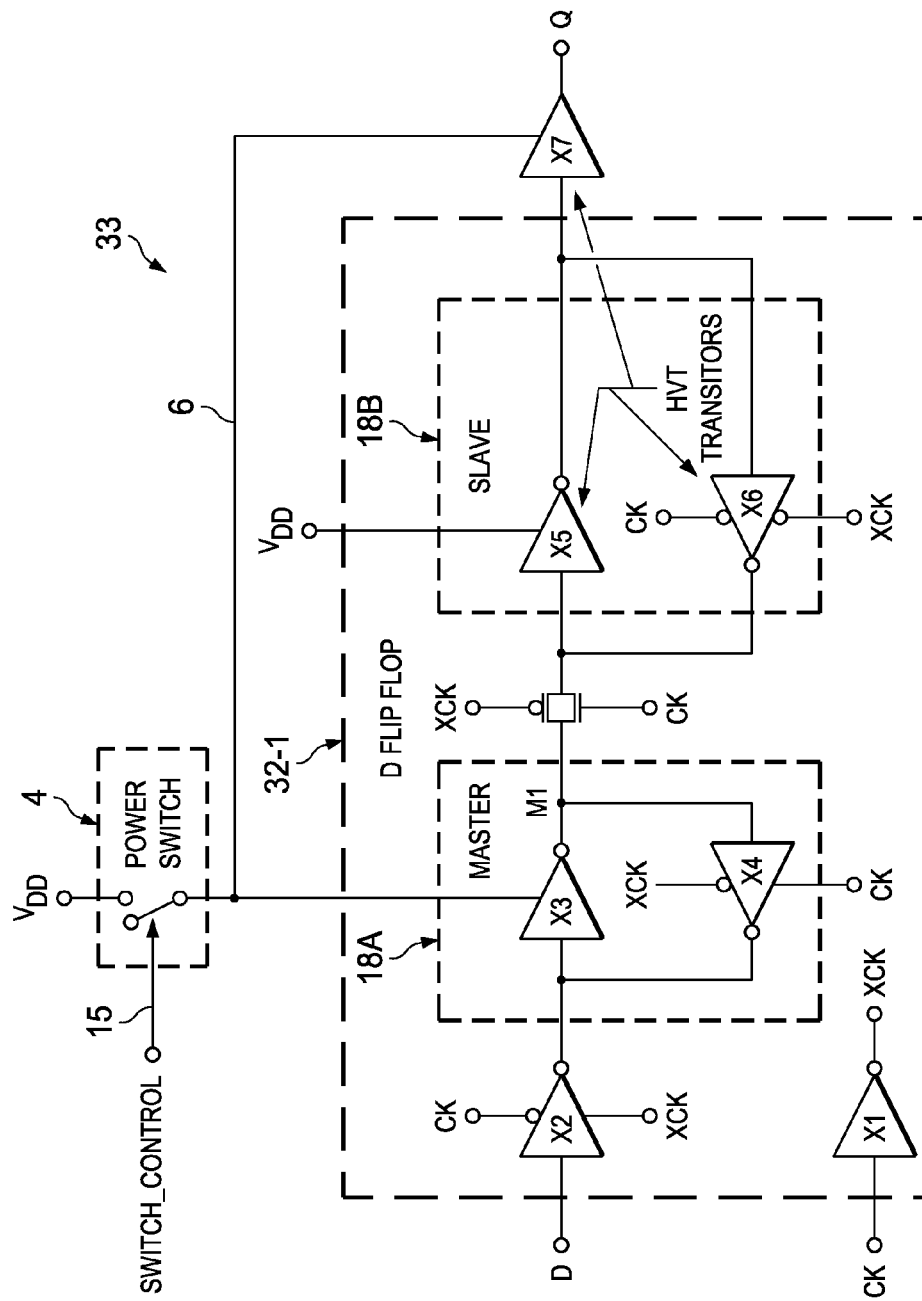
FIG. 5B a block diagram of a D-type flip-flop used in conjunction with the circuit and technique shown in FIG. 3B.

Circuit 32 in FIG. 5A and circuit 33 in FIG. 5B each include a D-type flip-flop circuit 32-1 that performs the function of retaining data in a switchable power domain when power switch 4 is OFF (i.e., open) in response to an active level of isolation control signal ISO so that the switchable power domain containing D-type flip-flop circuit 32-1 is in its OFF condition. D-type flip-flop circuit 32-1 includes an input inverter X2, a master latch 18A including CMOS input inverters X3 and X4, a CMOS transmission gate M1, and a slave latch 18B including CMOS output inverters X5 and X6. The output of master latch 18A is coupled by CMOS transmission gate M1 to the input of slave latch 18B. Slave latch 18B is composed of HVT transistors. The output of slave latch 18B is coupled to the input of an output inverter X7 in both circuit 32 of FIG. 5A and circuit 33 of FIG. 5B. Power switch 4 is coupled between $V_{DD}$ and conductor 6. Conductor 6 is connected to supply operating power from power switch 4 to inverters X3 and X4 in master latch 18A, to output inverter X7, and to inverters X1 and X2. $V_{DD}$ is connected to always supply operating power to inverters X5 and X6 in slave latch 18B.

In FIG. 5A, the previously described technique of using the HVT AND gate 25-2 (also see FIG. 3A) disables the output of slave latch 18B of D-type flip-flop 32-1 from the gate electrode of the input transistor of a circuit within a switchable power domain in response to the active level of ISO to control the input of output inverter X7. Specifically, D-type flip-flop 32-1 includes the same master latch 18A and the same slave latch 18B mentioned above with reference to FIG. 3A. AND gate 25-2 has one input connected to the output of slave latch 18B and has its other input connected to receive the gating signal ISO on conductor 17. The output of AND gate 25-2 forces a low "0" voltage on the input of output inverter X7 of D-type flip-flop 32-1. That prevents CMOS output inverter X7 from having high gate leakage current during the active level of ISO, and also allows output inverter X7 to be composed of SVT (low threshold voltage) transistors so faster circuit performance can be achieved. Thus, using the technique of previously described FIG. 3A in the circuit of FIG. 5A reduces the input voltage of SVT CMOS inverter X7 to greatly reduce its gate leakage current. Inverters X5 and X6 of slave latch 18B are composed of HVT transistors to reduce the sub-threshold leakage currents of transistors of inverters X5 and X6. (Note that the sub-threshold leakage current of a MOS transistor is less than its gate leakage current.)

Figure 2B:
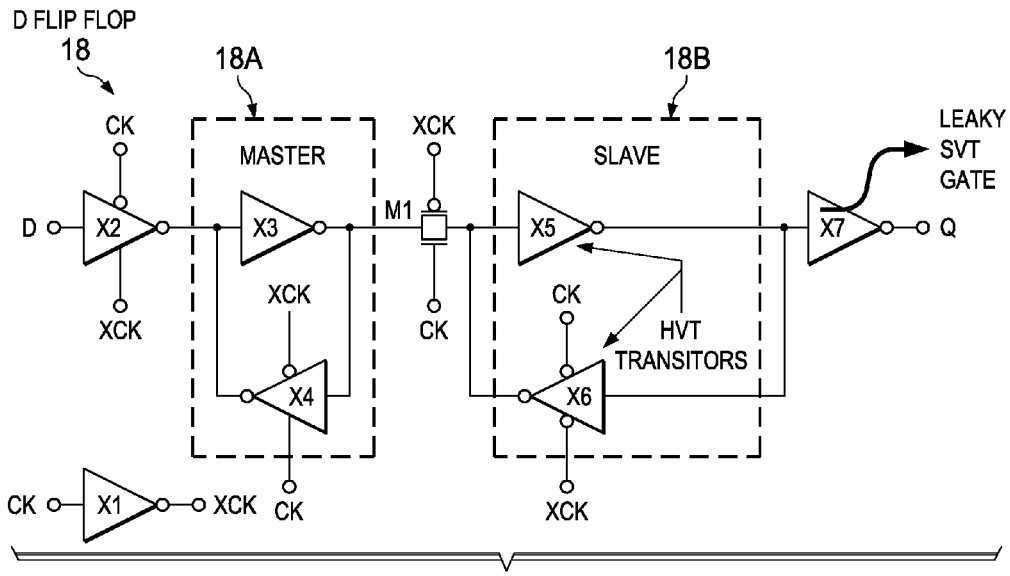
FIG. 2B is a block diagram of a D-type flip-flop used in a switchable power domain of an SOC chip.

Circuit 33 in FIG. 5B is similar to above described circuit 32 in FIG. 5A but utilizes the previously described technique previously described with reference to FIG. 3B to insert one or more very high threshold transistors (rather than SVT transistors as in Prior Art FIG. 2B) in slave latch 18B at the input of a switchable power domain so that gate leakage current in output inverter X7 is substantially reduced. The previously described technique of FIG. 3B reduces the input voltage of a driven CMOS inverter (such as CMOS inverter 3) to reduce its gate leakage currents through its N-channel transistor and its P-channel transistor, by coupling a HVT inverter (or transistor) between a logic input signal (VLOGIC_IN of FIG. 3B) and the gate electrodes of the driven input transistors of CMOS inverter 3.

Figure 2C:
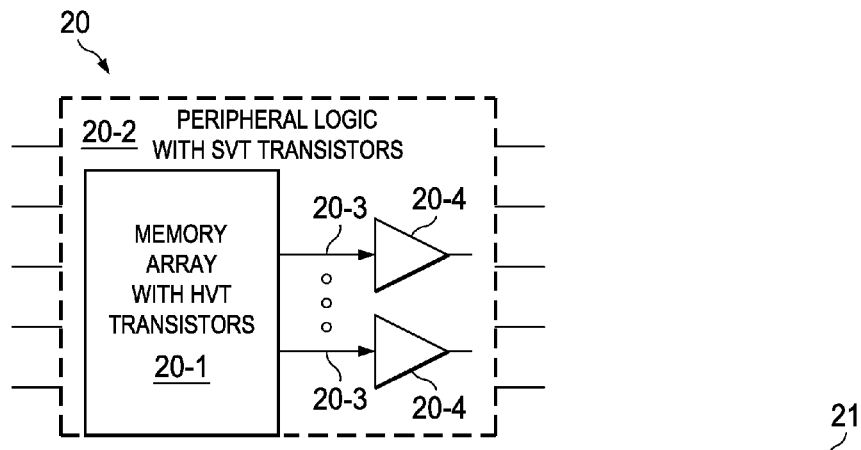
FIG. 2C is a block diagram illustrating a memory array in a switchable power domain of a SOC chip.
Figure 2D:
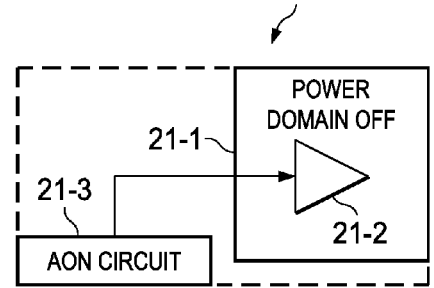
FIG. 2D is a block diagram illustrating an AON circuit driving logic circuitry in a switched power domain.
Figure 2E:
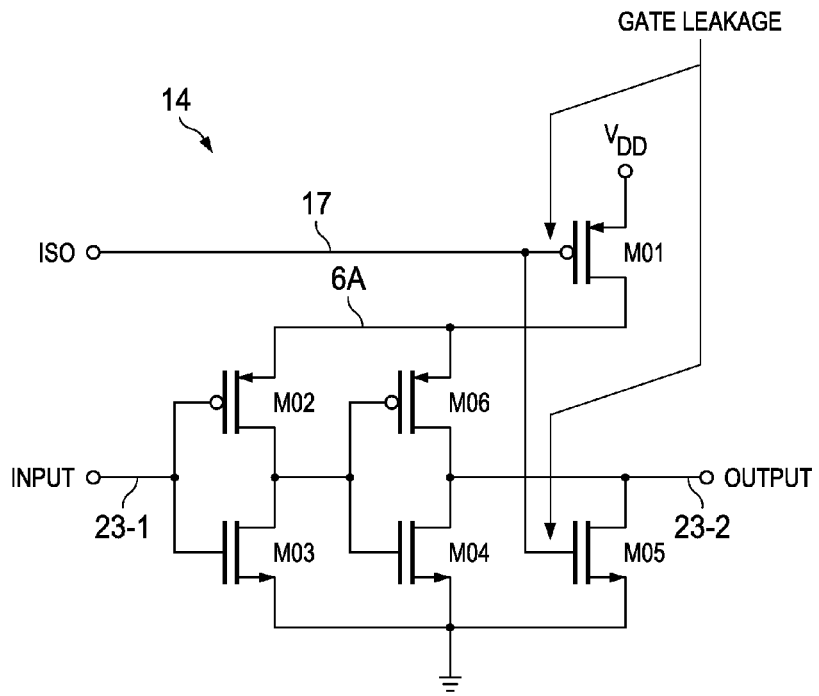
FIG. 2E is a schematic diagram of a conventional isolation cell used in a switchable power domain of an SOC.
Figure 6A:
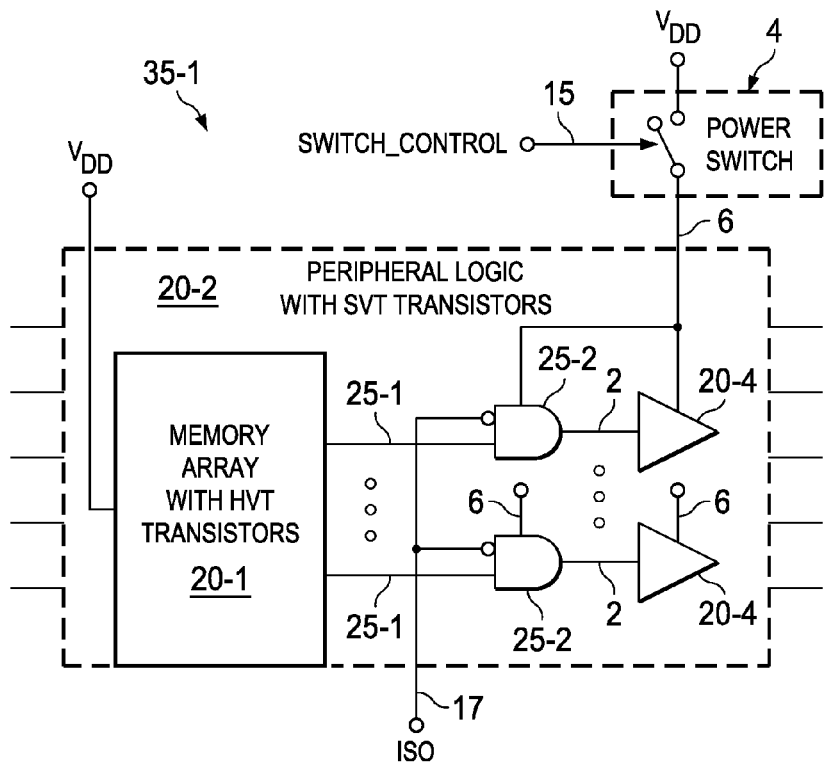
FIG. 6A is a block diagram of an SOC chip including a memory array for use in conjunction with the circuit and technique shown in FIG. 3A.

Referring to FIG. 6A, circuitry 35-1 includes a memory array 20-1 which is always powered by $V_{DD}$, i.e., is located in an AON power domain. Memory array 20-1 is composed of HVT transistors in order to reduce gate leakage currents. (The individual memory cells in memory array 20-1 can be similar to or the same as the D-type flip-flops of FIG. 2C.) Circuitry 35-1 in FIG. 6A also includes conventional associated peripheral logic circuitry 20-2 coupled to memory array 20-1 to perform ordinary read and write operations. Peripheral logic circuitry 20-2 is always included in an AON domain and therefore is powered through power switch 4 and conductor 6. A number of HVT AND gates 25-2 each have one input that receives a corresponding signal such as VLOGIC-IN on conductor 25-1. The other input of each AND gate 25-2 receives a gating signal ISO on conductor 17. The outputs of AND gates 25-2 are connected by multiple conductors 2 to the inputs of corresponding CMOS inverters 20-4, respectively. (Each of CMOS inverters 20-4 can be as shown in FIG. 3A.) CMOS inverters 20-4 are located in a switchable power domain that is powered through power switch 4 and conductor 6 when ISO is "active".

The transistors in CMOS inverters 20-4 should be SVT transistors to achieve fast circuit operation. The active level of the ISO signal in effect disables the gate leakage currents $I_{LEAKN}$ and $I_{LEAKP}$ in each CMOS inverter 20-4 by forcing a low "0" voltage level on the gate electrodes of transistors MP1 and MN1 of CMOS inverters 20-4. Thus, AND gates 25-2 respond to gating signal ISO to produce low "0" voltage levels on the various CMOS inverter inputs 2 when the gating signal ISO has an active value when the switchable power domain containing CMOS inverters 20-4 is in its OFF condition. Since the leakage currents $I_{LEAKN}$ and $I_{LEAKP}$ occur when the input voltage on conductor 2 is at a high "1" voltage level and power switch 4 is open, the low "0" voltage levels forced onto conductors 2 when gating signal ISO is at a "1" level disables all of the leakage currents $I_{LEAKN}$ and $I_{LEAKP}$.

Figure 6B:
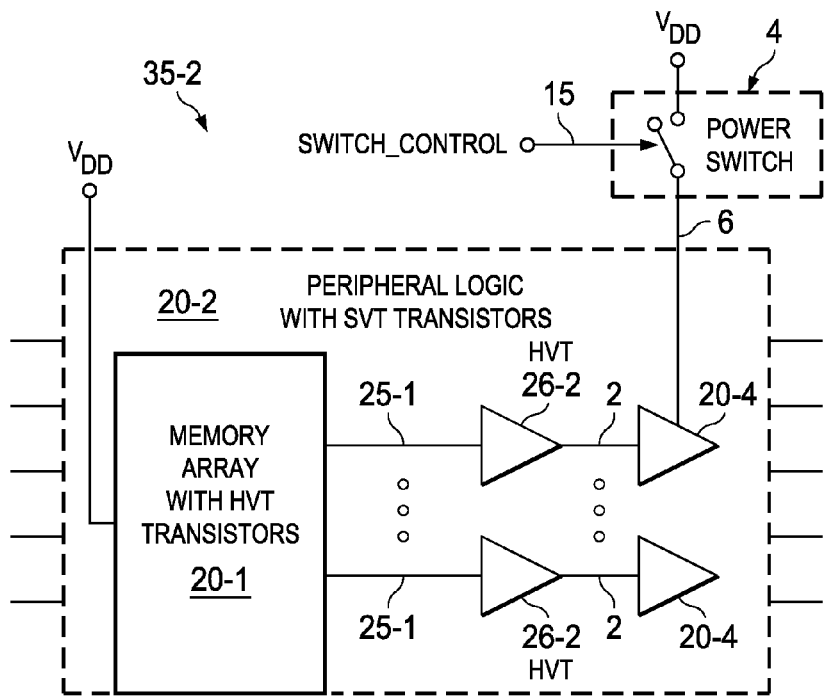
FIG. 6B is a schematic diagram of an SOC chip including a memory array for use in conjunction with the circuit and technique shown in FIG. 3B.

In FIG. 6B, each of a number of CMOS inverters 26-2, which are shown in FIG. 3B, includes a P-channel transistor MP2 having its source and body electrodes connected to $V_{DD}$, its drain electrode coupled by corresponding conductors 2 to the drain of N-channel transistor MN2, and its source and body electrodes connected to ground. The gate electrodes of transistors MP2 and MN2 (FIG. 3B) are connected to receive a signal such as VLOGIC_IN signal on corresponding conductors 25-1. Transistors MP2 and MN2 in each CMOS inverter 26-2 are HVT transistors in order to reduce gate leakage currents in the multiple CMOS inverters 26-2, respectively.

Thus, another way of substantially reducing gate leakage currents in an SOC chip is to provide HVT CMOS inverters between the inputs of CMOS inverters 20-4 located in a switchable power domain and corresponding input logic signals such as the various VLOGIC_IN signals generated by circuitry in or associated with memory array 20-1, which is in a AON power domain. The digital input signal VLOGIC_IN forces the input voltage of CMOS inverter 3 (also see FIG. 3B) to be a "0" whenever the switched power domain containing the CMOS inverter 3 is in its OFF condition.

Figure 7A:
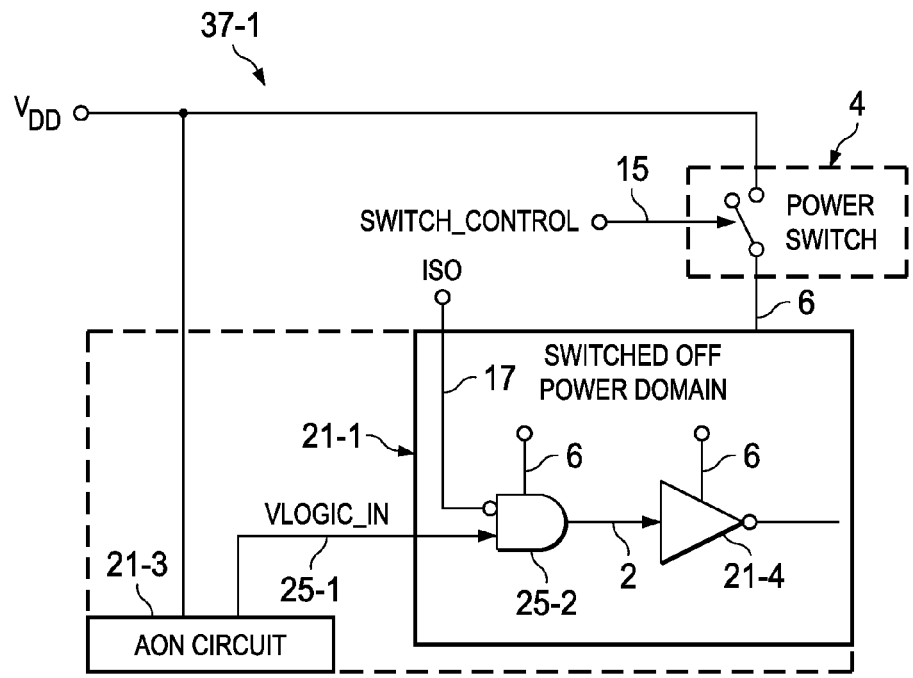
FIG. 7A is a block diagram illustrating an SOC chip including AON circuitry driving circuitry shown in FIG. 2D in conjunction with the circuit and technique shown in FIG. 3A.

Referring to FIG. 7A, yet another example of a way to use the circuit and technique of FIG. 3A provides a low-power SOC chip 37-1 including a switchable power domain 21-1 that is powered by $V_{DD}$ through conductor 6 and power switch 4 when ISO is "active" and is illustrated in FIG. 7A as being in its OFF condition. Switchable power domain 21-1 includes an AND gate 25-2 having one input 25-1 that receives a signal such as VLOGIC_IN generated by AON circuitry 21-3 in an adjacent AON power domain of the substrate on which SOC chip 37-1 is fabricated. The output of AND gate 25-2 is connected to the input 2 of CMOS inverter 20-4, which is the same as CMOS inverter 3 in FIG. 3A. AON circuitry 21-3 may be driving VLOGIC_IN to either a high logic "1" or a low logic "0" voltage level applied to one input of AND gate 25-2 in switchable power domain 21-1. Consequently, there may be unacceptably high amounts of gate leakage current in the transistors of CMOS inverter 21-4 caused by the high logic "1" level even though power domain 21-1 is in its OFF condition. The other input of AND gate 25-2 receives gating signal ISO on conductor 17. The transistors MP1 and MN1 in CMOS inverter 20-4 (which is the same as inverter 3 in FIG. 3A) should be SVT transistors in order to achieve fast circuit performance. The active level of ISO disables the gate leakage currents $I_{LEAKN}$ and $I_{LEAKP}$ by forcing a low "0" voltage level on the gate electrodes of transistors MP1 and MN1. Thus, gate circuit or AND gate 25-2 responds to gating signal ISO to produce low "0" voltage levels on CMOS inverter input conductor 2 when gating signal ISO has an active value when the switchable power domain 21-1 containing CMOS inverter 20-4 is OFF. The low "0" voltage level on conductor 2 effectively disables the gate leakage currents $I_{LEAKN}$ and $I_{LEAKP}$.

Figure 7B:
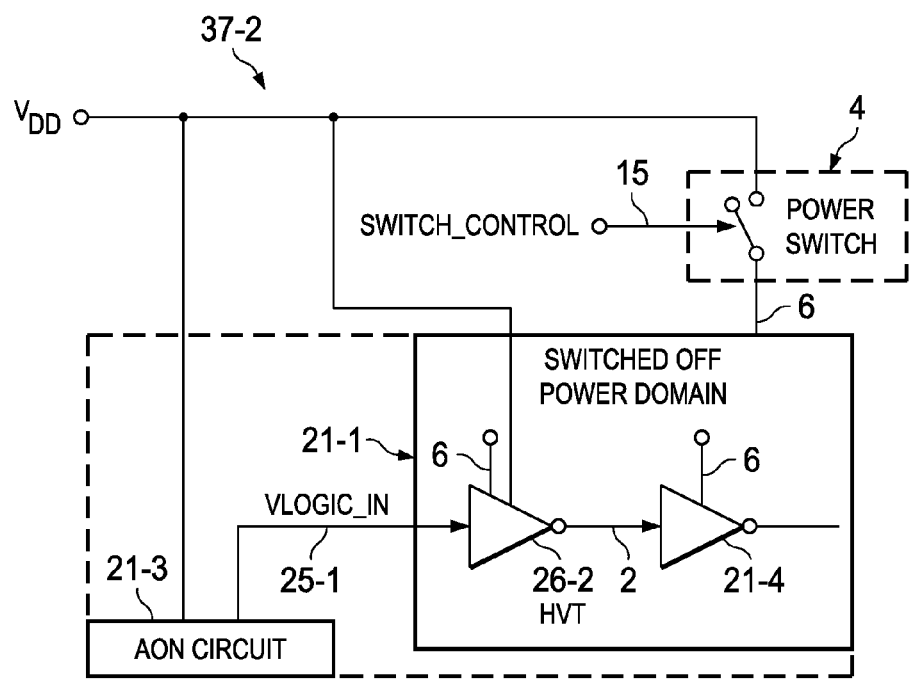
FIG. 7B is a block diagram illustrating an SOC chip including AON circuitry driving circuitry shown in FIG. 2D in conjunction with the circuit and technique shown in FIG. 3B.

In FIG. 7B, CMOS inverter 26-2, which is the same as CMOS inverter 26-2 in FIG. 3B, is powered by $V_{DD}$ and includes a P-channel transistor MP2 having its source and body electrodes connected to $V_{DD}$, its drain electrode coupled by conductor 2 to the drain of a N-channel transistor MN2, and its source and body electrodes connected to ground. The gate electrodes of transistors MP2 and MN2 (FIG. 3B) are connected to receive the VLOGIC_IN signal on conductor 25-1. Those transistors MP2 and MN2 are HVT transistors, in order to reduce gate leakage currents in CMOS inverter 26-2. This substantially reduces gate leakage current in transistors MP1 and MN1 of CMOS inverter 20-4 in switchable power domain 21-4. The digital input signal VLOGIC_IN forces the input voltage of CMOS inverter 3 (also see FIG. 3B) to be a "0" whenever the switched power domain containing the CMOS inverter 3 is in its OFF condition.

Note that the locations of gate leakage currents in an SOC chip can be determined by obtaining a thermal profile of the chip surface, especially along the edges of various or boundaries of switchable power domains, by powering the SOC chip measuring surface temperature changes along switchable power domain boundaries as operating modes of the SOC chip are changed.

The described embodiments of the invention provide the advantage of using a custom isolation cell to provide high speed performance in SOC chips that have low gate leakage currents and therefore have reduced power consumption and therefore provide increased battery life. In one example, the amount of gate leakage current in a isolation cell composed mainly of SVT (low threshold) transistors has been reduced by a factor of roughly 20. This may be very advantageous is a low power SOC chip that includes a processor or microcontroller, memory, and numerous other circuits such as analog circuitry, digital circuitry, ADCs, DACs, modems, etc. for various applications. For example, in some applications such as fire alarm systems, systems for monitoring water quality, and various other intermittent metering monitoring applications, the low power SOC chip may be in its off or sleep mode nearly all of the time.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A circuit for reducing gate leakage current in a switchable power domain of a CMOS (complementary metal oxide semiconductor) integrated circuit chip, comprising:
   (a) a first transistor having a drain electrode coupled to a first terminal of a power switch having a second terminal coupled to a first reference voltage, the first transistor having a gate electrode, a body electrode, and a source electrode, the source electrode and body electrodes being coupled to a second reference voltage, the first transistor having a relatively high first gate leakage current that flows from its gate electrode to its body electrode if the power switch is open and a voltage of the gate electrode of the first transistor representing a first logic level exceeds a voltage of the body electrode by more than a first predetermined amount; and
   (b) a first circuit for producing a relatively low voltage on the gate electrode of the first transistor representing a second logic level to substantially reduce the first gate leakage current when reduced power consumption of the chip is needed.

2. The circuit of claim 1 wherein the first circuit includes a logic ANDing circuit which has a first input coupled to receive a first logic signal and a second input coupled to receive a gate leakage current disabling signal, an output of the logic ANDing circuit being coupled to the gate electrode of the first transistor, wherein the logic ANDing circuit applies the relatively low voltage on the gate electrode of the first transistor when the gate leakage current disabling signal has a predetermined active value indicating that the power switch is open.

3. The circuit of claim 2 including a second transistor having a source electrode and a body electrode coupled to the first terminal of the power switch having a drain electrode coupled to and the drain electrode of the first transistor.

4. The circuit of claim 3 wherein the first transistor is a N-channel transistor and the second transistor is a P-channel transistor, the second transistor having a gate electrode coupled to the gate electrode of the first transistor, the first and second transistors forming a CMOS inverter.

5. The circuit of claim 1 wherein the first transistor is a SVT (low threshold voltage) transistor.

6. The circuit of claim 5 wherein the second transistor is a SVT (low threshold voltage) transistor.

7. The circuit of claim 6 wherein the first logic signal is a gated logic signal that has been produced to have a logic level that causes the first circuit to produce a low voltage level on the gate of the first transistor when the power switch is open.

8. The circuit of claim 1 wherein the first circuit includes a CMOS inverter composed of HVT (high threshold) transistors.

9. The circuit of claim 8 including a second transistor coupled between the first terminal of the power switch and the drain electrode of the first transistor.

10. The circuit of claim 9 wherein the first transistor is a N-channel transistor and the second transistor is a P-channel transistor, the second transistor having a gate electrode coupled to the gate electrode of the first transistor, the first and second transistors forming a CMOS inverter.

11. The circuit of claim 1 wherein the logic ANDing circuit includes AND gate circuitry.

12. The circuit of claim 1 wherein the first transistor is located in a switchable power domain which is coupled to the first terminal of the power switch.

13. The circuit of claim 12 wherein the gate electrode of the first transistor is connected to a circuit located in an always-on power domain.

14. The circuit of claim 13 wherein the first transistor is part of an inverter located in the switchable power domain.

15. A method for reducing gate leakage current in a switchable power domain of a CMOS (complementary metal oxide semiconductor) integrated circuit chip, the method comprising:
   (a) coupling a drain electrode of a first transistor to a first terminal of a power switch having a second terminal coupled to a first reference voltage, and coupling a body electrode and a source electrode of the first transistor to a second reference voltage, the first transistor having a gate electrode and a relatively high first gate leakage current that flows from its gate electrode to its body electrode if the power switch is open and a voltage of the gate electrode of the first transistor resenting a first logic level exceeds a voltage of the body electrode by more than a first predetermined amount; and
   (b) producing a relatively low voltage on the gate electrode of the first transistor representing a second logic level to substantially reduce the first gate leakage current when reduced power consumption of the chip is needed.

16. The method of claim 15 including coupling a first input of a logic ANDing circuit to receive a first logic signal and coupling a second input of the logic ANDing circuit to receive a gate leakage current disabling signal, coupling an output of the logic ANDing circuit to the gate electrode of the first transistor, and operating the logic ANDing circuit to cause it to apply the relatively low voltage on the gate electrode of the first transistor when the gate leakage current disabling signal has a predetermined active value indicating that the power switch is open.

17. The method of claim 16 including coupling a source electrode and a body electrode of a second transistor to the first terminal of the power switch and coupling a drain electrode of the second transistor to the drain electrode of the first transistor, wherein the first transistor is a N-channel transistor and the second transistor is a P-channel transistor, the second transistor having a gate electrode coupled to the gate electrode of the first transistor, the first and second transistors forming a CMOS inverter, wherein the first and second transistors are SVT (low threshold voltage) transistors.

18. The method of claim 15 including coupling an input of a CMOS inverter to receive a first logic signal and coupling an output of the CMOS inverter to the gate electrode of the first transistor, and operating the CMOS inverter to cause it to apply the relatively low voltage on the gate electrode of the first transistor when the power switch is open, wherein the CMOS inverter is composed of HVT (high threshold) transistors.

19. The method of claim 18 including providing the first logic signal as a logic signal that has been produced to have a logic level that causes the first circuit to produce a low voltage level on the gate of the first transistor when the power switch is open.

20. A circuit for reducing gate leakage current in a switchable power domain of a CMOS (complementary metal oxide semiconductor) integrated circuit chip, comprising:

(a) means in the switchable power domain for coupling a drain electrode of a first transistor to a first terminal of a power switch having a second terminal coupled to a first reference voltage and coupling a body electrode and a source electrode of the first transistor to a second reference voltage, the first transistor having a gate electrode and a relatively high first gate leakage current that flows from its gate electrode to its body electrode if the power switch is open and a voltage of the gate electrode of the first transistor representing a first logic level exceeds a voltage of the body electrode by more than a first predetermined amount; and (b) means in the switchable power domain for producing a relatively low voltage on the gate electrode of the first transistor representing a second logic level to substantially reduce the first gate leakage current when reduced power consumption of the chip is needed.

\* \* \* \* \*